(12) United States Patent
Tomita et al.

(10) Patent No.: US 6,812,574 B2
(45) Date of Patent: Nov. 2, 2004

(54) SEMICONDUCTOR STORAGE DEVICE AND METHOD OF FABRICATING THE SAME

(75) Inventors: Hidemoto Tomita, Tokyo (JP); Shigeki Ohbayashi, Tokyo (JP); Yoshiyuki Ishigaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 23 days.

(21) Appl. No.: 10/190,715

(22) Filed: Jul. 9, 2002

(65) Prior Publication Data

US 2003/0128565 A1 Jul. 10, 2003

(30) Foreign Application Priority Data

Jan. 10, 2002 (JP) ...................................... P2002-003266

(51) Int. Cl.[7] .............................................. H01L 23/48
(52) U.S. Cl. ..................... 257/773; 257/298; 257/368; 257/903; 257/904
(58) Field of Search ................................ 257/368, 298, 257/903, 904, 773

(56) References Cited

U.S. PATENT DOCUMENTS

| | | | | |
|---|---|---|---|---|
| 5,083,178 A | * | 1/1992 | Otsu | ........................... 257/208 |
| 5,541,427 A | | 7/1996 | Chappell et al. | |
| 5,596,212 A | * | 1/1997 | Kuriyama | ................... 257/298 |
| 5,744,844 A | | 4/1998 | Higuchi | |
| 5,930,163 A | | 7/1999 | Hara et al. | |
| 6,160,298 A | * | 12/2000 | Ohkubo | ....................... 257/393 |
| 6,229,186 B1 | | 5/2001 | Ishida | |
| 6,359,804 B2 | * | 3/2002 | Kuriyama et al. | .......... 365/154 |
| 6,479,905 B1 | * | 11/2002 | Song | ........................... 257/365 |

FOREIGN PATENT DOCUMENTS

| | | |
|---|---|---|
| JP | 9-270468 | 10/1997 |
| JP | 10-178110 | 6/1998 |
| JP | 2000-31298 | 1/2000 |
| JP | 2000-124332 | 4/2000 |
| JP | 2000-208643 | 7/2000 |

* cited by examiner

*Primary Examiner*—Richard Elms
*Assistant Examiner*—Doug Menz
(74) *Attorney, Agent, or Firm*—McDermott Will & Emery LLP

(57) ABSTRACT

A semiconductor storage device includes a memory cell array, a plurality of word lines, a plurality of bit lines, a first gate wiring element 3a, 3b, a second gate wiring element 3c, 3d, a first connector 5a, 5b, and a second connector 5c, 5d. Each memory cell 10 has first and second sets having a driver transistor 11, a load transistor 12, and an access transistor 13. The word lines are arranged in parallel to each other along a first direction. The bit lines are arranged in parallel to each other along a second direction perpendicular to the first direction. The first gate wiring element comprises a gate electrode of the first driver transistor and the first load transistor, and has a rectangular shape having straight line on opposite sides. The second gate wiring element comprises a gate electrode of the access transistor and has a rectangular shape having straight line on opposite sides.

11 Claims, 11 Drawing Sheets

SEMICONDUCTOR STORAGE DEVICE AND METHOD OF FABRICATING THE SAME

BACKGROUND OF THE INVENTION

1. Field of the Invention

The present invention relates to a semiconductor storage device and, more particularly, to a static random access memory.

2. Description of the Prior Art

A static random access memory (hereinafter referred to as "SRAM") is useful because it does not require refresh operation. However, the number of elements constituting one memory cell in the SRAM is large to increase an occupied area by the memory cell. For this reason, it is required to reduce a cell area. For example, Japanese Laid-open Patent Publication No.9-270468 (U.S. Pat. No. 5,744,844) and Japanese Laid-open Patent Publication No. 10-178110 (U.S. Pat. No. 5,930,163) illustrate examples of cell layout in which one cell having a length in a word line direction which is larger than a length in a bit line direction. Of the examples, a flat configuration of the SRAM described in Japanese Laid-open Patent Publication No. 10-178110 is shown in FIGS. 16 and 17. FIG. 16 is a plan view related to one memory cell of the SRAM. FIG. 17 is an equivalent circuit diagram corresponding to the memory cell shown in FIG. 16. The length in the bit line direction is shortened to increase the speed, and the layout of an active layer and a gate wiring element has a simple shape to reduce a cell area.

From a viewpoint of decreasing patterning size, a phenomenon (optical proximity) in which a resist pattern on a wafer is distorted becomes conspicuous due to the interference of light in an exposure device. In addition, even in an etching process, pattern distortion is generated by the micro-loading effect after etching. The micro-loading effect is a phenomenon in which an etching rate decreases in a direction of depth when a pattern having a large difference in density. In recent years, in order to minimize these pattern distortions phenomena, a technique for the optical proximity correction (OPC) is developed and used in which a mask pattern is automatically corrected in advance in a photography process.

In general, in order to form a contact by forming a contact hole in a gate wiring element, a cover margin such as a lithographic margin and a machining margin must be set in consideration of blur in photolithography process. For this reason, a portion in which a contact hole should be formed on the gate wiring element must be deformed by increasing the width of the portion by a length corresponding to a cover margin. In addition, since a width must be partially increased to make the width of the gate wiring element fine, decreasing patterning size cannot be achieved easily.

In order to decrease patterning size in consideration of an optical proximity correction (OPC) pattern obtained by the optical proximity correction (OPC) technique, when gate wiring elements are complicatedly arranged, margins for the optical proximity correction must be set in the longitudinal and lateral directions. For this reason, a memory cell area cannot be reduced sufficiently because sufficient decrease in size cannot be achieved, and the margins are factors which hinder decrease in size.

SUMMARY OF THE INVENTION

It is an object of the present invention to secure lithographic and machining margins without complicatedly deforming a gate shape in formation of a gate wiring element of a semiconductor storage device, especially, an SRAM.

In accordance with one aspect of the present invention, there is a semiconductor storage device including a memory cell array, a plurality of word lines, a plurality of bit lines, a first gate wiring element, a second gate wiring element, a first connector, and a second connector. The memory cell array has a plurality of memory cells. Each memory cell has first and second driver transistors, first and second load transistors, and first and second access transistors. That is to say, first and second sets each having a driver transistors, a load transistors, and an access transistors are designed in each memory cell within SRAM. The memory cells are two-dimensionally arranged on a semiconductor substrate. The word lines are connected to the memory cells and are arranged in parallel to each other along a first direction. The bit lines are connected to the memory cells and are arranged in parallel to each other along a second direction perpendicular to the first direction. The first gate wiring element composes a gate electrode of the first driver transistor and the first load transistor, and has a rectangular shape having straight line on opposite sides. The second gate wiring element composes a gate electrode of the access transistor, and has a rectangular shape having straight line on opposite sides. That is to say, the first and second gate wiring element have fair lines such as notch-less shape. The first connector connects the first gate wiring element, an active region of the second driver transistor, and an active region of the second load transistor to each other. The second connector connects the second gate wiring element to the word lines.

In another aspect of the present invention, there is a semiconductor storage device including a memory cell array, a plurality of word lines, a plurality of bit lines, a first gate wiring element, and a second gate wiring element. The memory cell array has a plurality of memory cells. Each memory cell has first and second driver transistors, first and second load transistors, and first and second access transistors are two-dimensionally arranged on a semiconductor substrate. The word lines are connected to the memory cells and arranged in parallel to each other along a first direction. The bit lines are connected to the memory cells and arranged in parallel to each other along a second direction perpendicular to the first direction. The first gate wiring element composes a gate electrode of the first driver transistor and the first load transistor. The second gate wiring element is connected to the access transistor.

In the semiconductor storage device according to the present invention, the first gate wiring element and the second gate wiring element have rectangular shapes each having straight line on opposite sides and being free from a notch or a projection, and are linearly laid out. In this manner, since the first and second gate wiring elements can be formed at high accuracy, the characteristics of transistors constituting a memory cells can be stabilized. For this reason, a semiconductor storage device having stable characteristics can be obtained. In the semiconductor storage device, contacts to the respective wiring elements are formed by using local inter connectors (LICs). More specifically, the contacts of the respective gate wiring elements are not formed through via holes directly formed on the gate wiring elements, but the contacts are formed by the local inter connectors (LICs) formed by tungsten damascene. When the local inter connectors (LICs) are used, regular gate wiring elements each having a rectangular shape can be laid out without making a cover margin for contact in formation of the gate wiring elements. In addition, since the first gate wiring elements and the second gate wiring elements are laid out in parallel to each other, in the step of forming gate wiring elements by photolithography process, pattern distortion caused by interference can be suppressed. Therefore, an optical proximity effect in the photolithography process can be suppressed.

BRIEF DESCRIPTION OF THE DRAWINGS

The present invention will become readily understood from the following description of preferred embodiments thereof made with reference to the accompanying drawings, in which like parts are designated by like reference numeral and in which.

DETAILED DESCRIPTION OF PREFERRED EMBODIMENTS

Semiconductor storage devices according to embodiments of the present invention and a method of fabricating the same will be described below with reference to the accompanying drawings.

Figure 1:
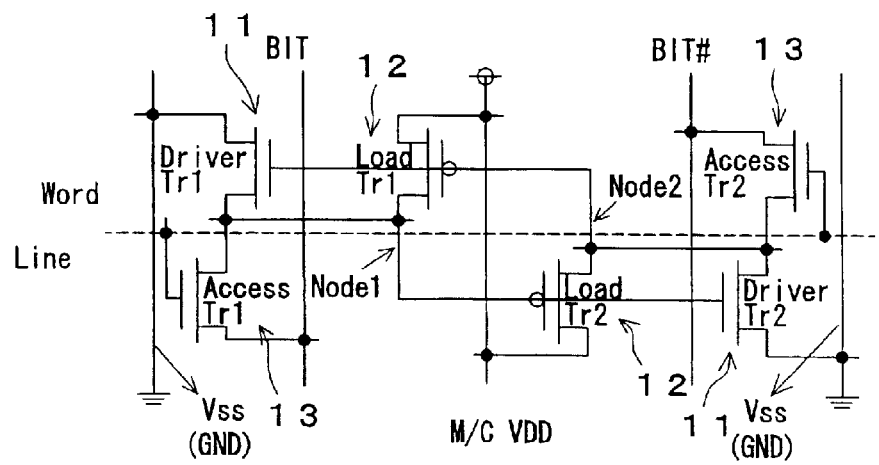
FIG. 1 is a circuit diagram of an equivalent circuit corresponding to one memory cell of a semiconductor storage device according to a first embodiment of the present invention.

A semiconductor storage device according to first embodiment of the present invention and a method of fabricating the same will be described below with reference to FIGS. 1 to 11. The semiconductor storage device will be described first with reference to FIGS. 1 to 7. The semiconductor storage device, as shown in FIG. 1, has a memory cell array in which memory cells 10 each including two sets of a driver transistor 11, a load transistor 12, and an access transistor 13 are two-dimensionally arranged. Wires of one of the memory cells 10 will be described below. This memory cell 10 has two types of gate wiring elements. More specifically, the memory cell 10 has a first gate wiring elements 3a and 3b composing a gate electrode of the driver transistor 11 to the load transistor 12, and connecting the driver transistor 11 to the load transistor 12. Additionally, the memory cell 10 has second gate wiring elements 3c and 3d composing a gate electrode of the access transistor 13, and connecting the access transistor 13 to a word line WL. The first gate wiring elements 3a, 3b and the second gate wiring elements 3c, 3d have rectangular shapes having straight line on opposite sides being free from a notch or a projection, and are laid out to have longitudinal directions thereof are parallel to the direction of the gate width of the access transistor 13. More specifically, the gate wiring elements 3 are laid out in parallel to longitudinal direction of a word line. In this manner, since the first and second gate wiring elements 3a, 3b, 3c, and 3d can be formed at high accuracy, the characteristics of the respective transistors can be made stable. For this reason, a semiconductor storage device having stable characteristics can be fabricated. The longitudinal direction of the word line is referred to as a first direction. A direction being perpendicular to the first direction is referred to as a second direction.

In Japanese Laid-open Patent Publications Nos. 2000-124332, 2000-208643, and 2000-31298 describe SRAMs each having a linearly arranged gate wiring element. However, in all the SRAMs described in these publications, contacts are formed by directly forming contact holes in the gate wiring elements. In fact, since a cover margin for making a contact is required, the gate wiring element is deformed or has an excessive width. For this reason, in contrast to the present invention, a rectangular gate wiring element cannot be obtained to have straight line on opposite sides and to be free from a notch and a projection. The "notch" mentioned here is a crena or a depression. Therefore, the "straight line" means that a side has substantially linear line formed without the notch.

In this semiconductor storage device, contacts to the gate wiring elements are formed by using the local inter connector (LIC) described in U.S. Pat. No. 5,541,427. More specifically, as the contacts to the respective gate wiring elements, contacts are not formed through via holes directly formed on the gate wiring elements, and they are formed by the local inter connectors (LICs) formed by tungsten damascene. By using the local inter connector LIC as described above, a cover margin for contact is not needed in fabrication of the gate wiring elements, and rectangular gate wiring elements can be laid out having straight line on opposite sides without a notch or a projection. Since the first gate wiring elements 3a and 3b and the second ones 3c and 3d are laid out in parallel to each other, pattern distortion caused by interference can be suppressed in the step of forming the gate wiring elements by photolithography process. For this reason, optical proximity effect in the photolithography process can be suppressed. Therefore, the gate wiring element can be in a small size.

Figure 2:
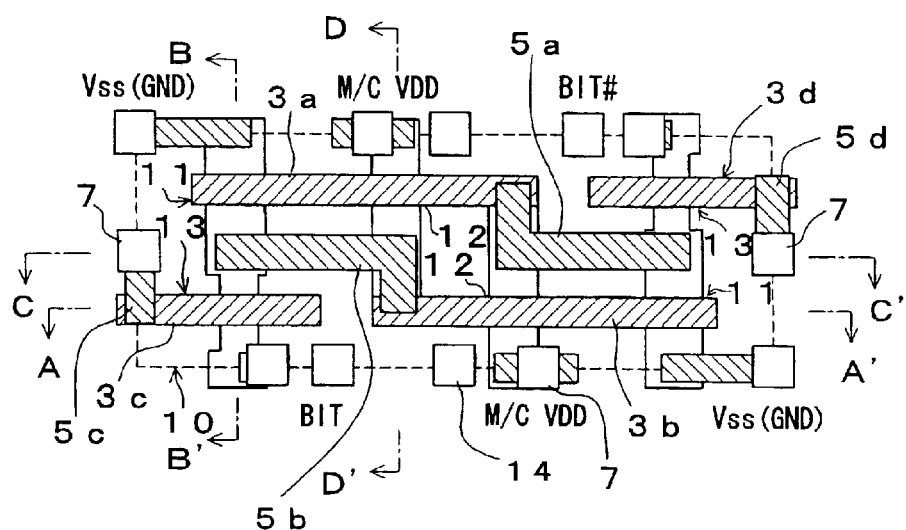
FIG. 2 is a plan view of a configuration in which gate wiring elements of the semiconductor storage device according to first embodiment of the present invention are centered.

In addition, the configuration of the semiconductor storage device will be described below. As shown in FIG. 1, The semiconductor storage device is an SRAM including first and second driver transistors 11, first and second load transistors 12, and first and second access transistors 13, which are arranged in one memory cell 10. In one memory cell 10 shown in FIGS. 1 and 2, a word line WL in the longitudinal direction is longer than a bit line BIT in the bit line direction. FIG. 2 shows a configuration in which connections between gate wiring elements 3a, 3b, 3c, and 3d and local inter connectors (LIC) 5a, 5b, 5c, and 5d are centered. Each first gate wiring element 3a and 3b composes a gate electrode of the driver transistors 11 and the load transistor 12. The first gate wiring elements 3a and 3b are also in contact with- the other driver transistor 11 and the other load transistor 12 in the same memory cell by the first local inter connectors (LIC) 5a and 5b made of tungsten (W) formed by a damascene process. Each second gate wiring element 3c, 3d composes a gate electrode of the access transistor 13. The second gate wiring elements 3c and 3d are also in contact with a word line by the second local inter connectors (LICs) 5c and 5d. Cross couple wires of an inverter in the memory cell are formed by using local inter connectors (LICs), a bit line is formed by a second metal wire, a VDD line is formed by a second metal wire, and a ground (GND) line is formed by a second metal wire.

Figure 3:
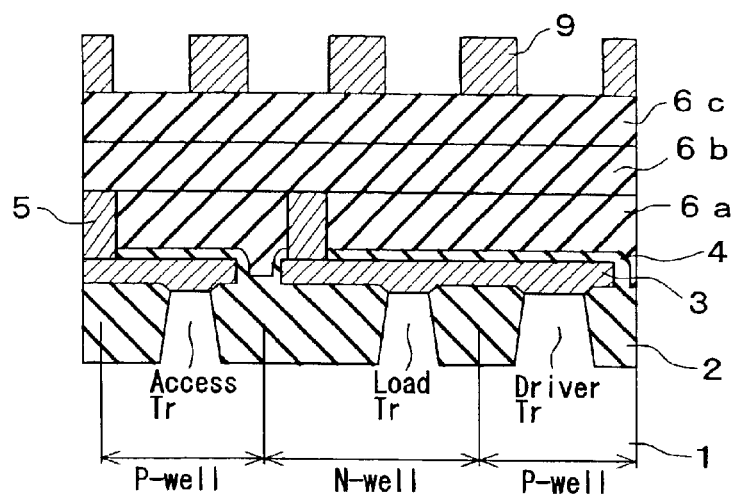
FIG. 3 is a sectional view of the configuration along A–A' line in FIG. 2.
Figure 4:
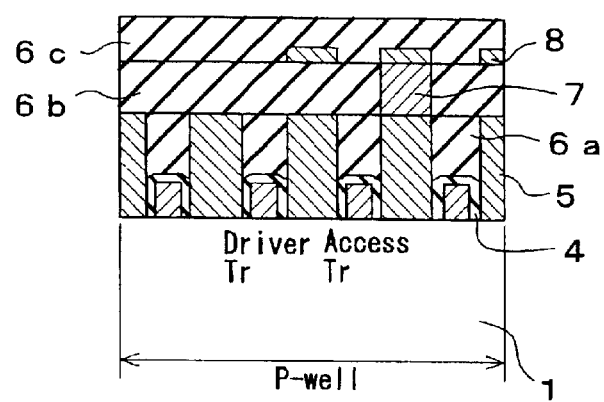
FIG. 4 is a sectional view of the configuration along B–B' line in FIG. 2.
Figure 5:
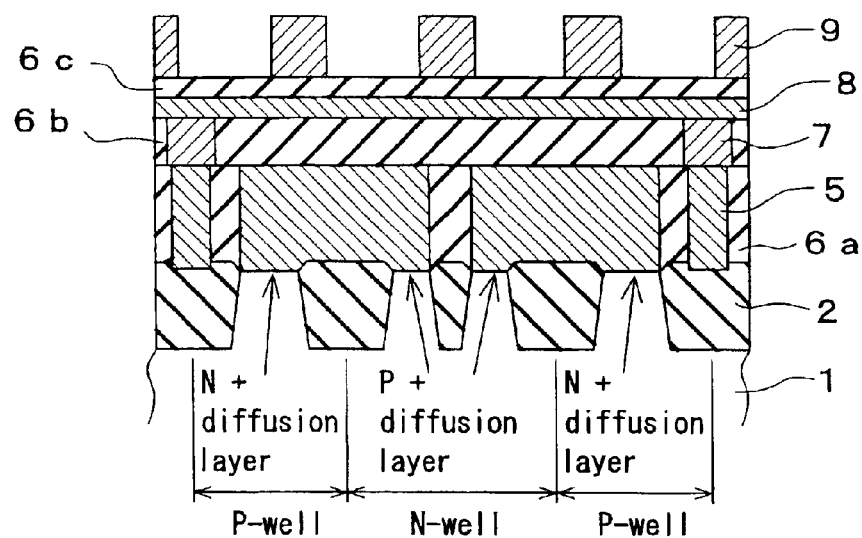
FIG. 5 is a sectional view of the configuration along C–C' line in FIG. 2.
Figure 6:
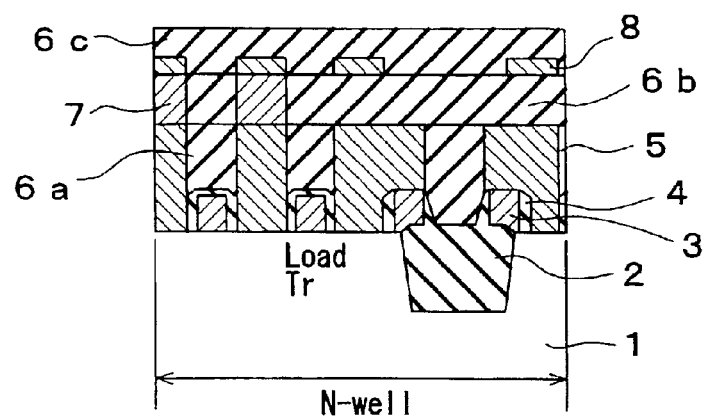
FIG. 6 is a sectional view of the configuration along D–D' line in FIG. 2.
Figure 7:
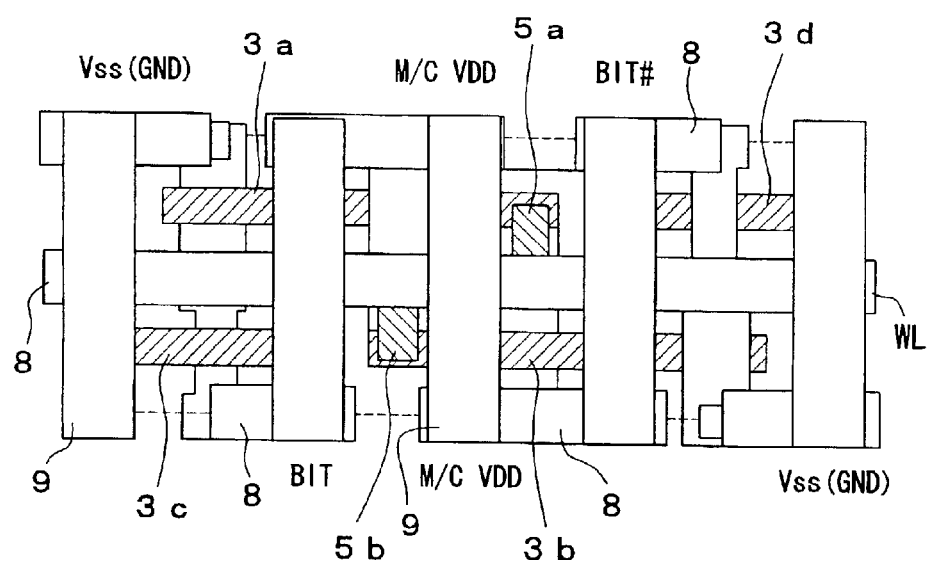
FIG. 7 is a conceptual plan view of a portion related to wires of a memory cell of the semiconductor storage device according to first embodiment of the present invention when viewed from the above.

Furthermore, a configuration extending from the substrate surface of a semiconductor substrate 1 of the semiconductor storage device in the vertical direction will be described below with reference to FIGS. 3 to 7. Of these drawings, FIGS. 3 to 6 are sectional views showing the structure along cut lines in FIG. 2. In the semiconductor substrate 1 of the semiconductor storage device, as shown in the sectional view along the longitudinal direction (first direction) of a word line in FIG. 3, a P well region, an N well region, and a P well region are sequentially formed along the first direction. In addition, the access transistor 13, the load transistor 12, and the driver transistors 11 are formed such that the transistors are isolated from each other by an element isolation oxide film. On the semiconductor substrate 1, the first gate wiring element 3b, made of poly-silicon, connecting the driver transistors 11 to the load transistor 12 extends along the first direction. The second gate wiring element 3c made of poly-silicon linearly extends on the access transistor 13 along the first direction. As shown in FIG. 3, the first and second gate wiring elements 3b and 3c, form contacts by the first and second local inter connectors 5b and 5c made of tungsten and buried in a trench for a local inter connector formed in an insulating interlayer deposited on the gate wiring elements. In addition, as shown in FIG. 4, the local inter connector LIC is connected to the first metal wiring element by a stack via hole. As shown in FIG. 5, the first local inter connectors (LICs) 5b and 5a made of tungsten are buried. As shown in FIG. 6, as to the connection between the gate wiring elements 3 and the local inter connectors (LICs) 5, even though mask offset happens offset by a side-wall width can be allowed. A configuration related to the wires of the semiconductor storage device is shown in the plan view in FIG. 7. FIG. 7 shows only a configuration related to the wires except for an insulating interlayer when viewed from the above.

A method of fabricating the semiconductor storage device will be described below with reference to FIGS. 8 to 11. This semiconductor storage device is fabricated by the following steps.

(a) A semiconductor substrate 1 is provided.

(b) The element isolation oxide film 2 is formed at a predetermined portion of the semiconductor substrate 1.

Figure 8:
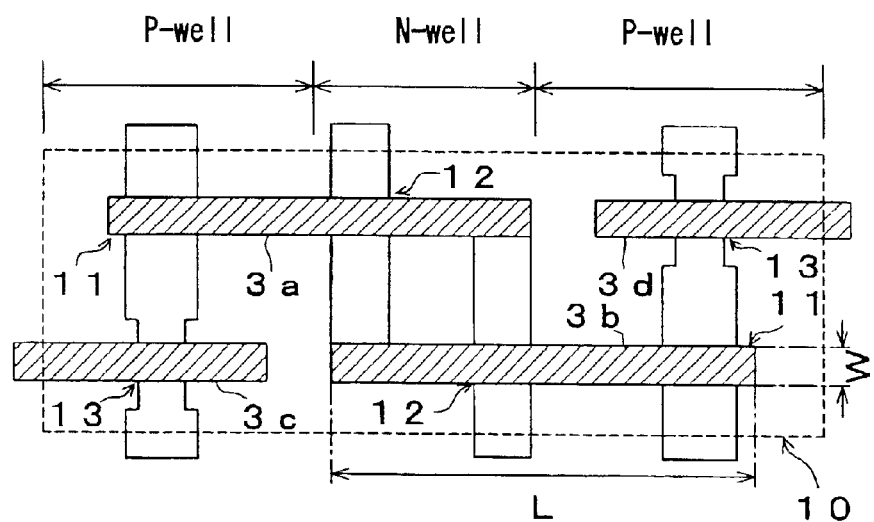
FIG. 8 is a plan view showing the step of forming gate wiring elements in a method of fabricating a semiconductor storage device according to first embodiment of the present invention.

(c) Ions are implanted in a predetermined portion to form a well region. In this case, as shown in FIG. 8, well regions are sequentially formed such that a P well region, an N well region, and a P well region are sequentially arranged on the semiconductor substrate 1. The direction of the arrangement is set as a first direction. The first direction is equal to the longitudinal direction of one memory cell 10.

(d) After a gate oxide film is deposited, and poly-silicon wiring layers 3 serving as gate wiring layers are deposited.

(e) Ion implantation is performed to form the transistors 11, 12, and 13.

(f) Thereafter patterning is performed, as shown in FIG. 8. In this manner, the first gate wiring elements 3a and 3b and the second ones 3c and 3d are formed. The first gate wiring elements 3a and 3b, as shown in FIG. 8, composes a gate electrode of the driver transistor 11 and the load transistor 12, and are linearly arranged along the first direction. The second gate wiring elements 3c and 3d composes a gate electrode of the access transistor 13, and are linearly arranged along the first direction. Each of the poly-silicon wiring layers 3 has a rectangular shape having straight line on opposite sides and being free from a notch or a projection, and is regularly arranged. For this reason, in patterning, the accuracy of decreasing patterning size can be improved.

(g) A sidewall 4 is formed.

(h) A source S and a drain D are formed by ion implantation.

(i) A $CoSi_2$ layer is formed.

(j) An etching stopper film is deposited. A flattening insulating film 6a is deposited.

(k) The flattening insulating film 6a is etched by using a mask for an local inter connector LIC. At this time, the etching is stopped by the etching stopper.

(l) The etching stopper film exposed by etching the flattening insulating film 6a is removed to form a trench for a local inter connector LIC.

(m) Tungsten is deposited in the trench for local inter connector LIC, and the resultant structure is flattened. The tungsten is left in only the trench (W damascene process) to form a local inter connector LIC 5 made of tungsten. The first local inter connectors (LICs) 5a and 5b and the second local inter connectors (LICs) 5c and 5d can be formed. Since contacts to the gate wiring elements can be formed through the local inter connectors (LICs) 5a, 5b, 5c, and 5d, the shapes of the gate wiring elements need not deformed to make a margin for contact. As the damascene method with respect to the first local inter connectors (LICs) 5a and 5b, a damascene method for forming only the wires can be used.

(n) A flattening insulating film 6b is deposited.

(o) Holes for stack via holes 7 are formed.

Figure 9:
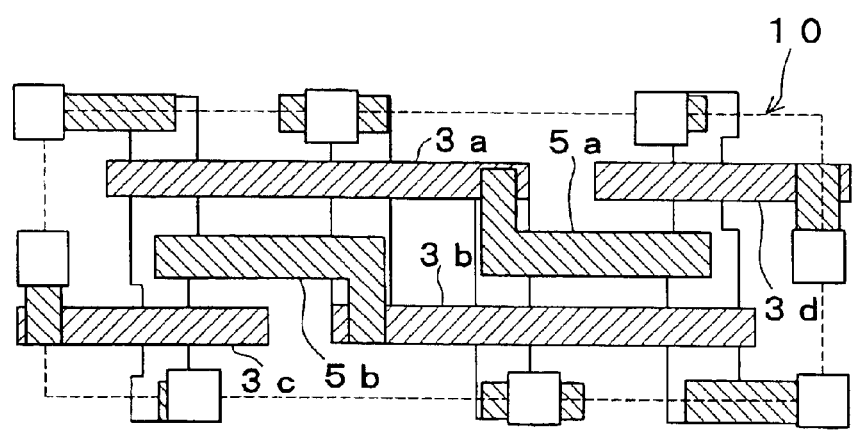
FIG. 9 is a plan view of a step of forming stack via holes for connecting a formed local inter connector LIC in the method.

(p) Tungsten is removed except for the local inter connectors (LICs) 5 and the stack via holes 7, as shown in FIG. 9. In this manner, the stack via holes 7 can be formed to connect the second gate wiring elements 3c and 3d to the word line WL through the second local inter connector LICs 5c and 5d.

(q) A first metal layer 8 is deposited on the entire surface of the resultant structure.

(r) The first metal layer 8 is removed by using a mask for a first metal wiring element except for on a predetermined portion. In this manner, as shown in FIG. 10, a word line WL constituted by the first metal layer 8 can be formed.

(s) An insulating interlayer 6c is deposited.

(t) A hole for a first via hole 14 is formed.

Figure 10:
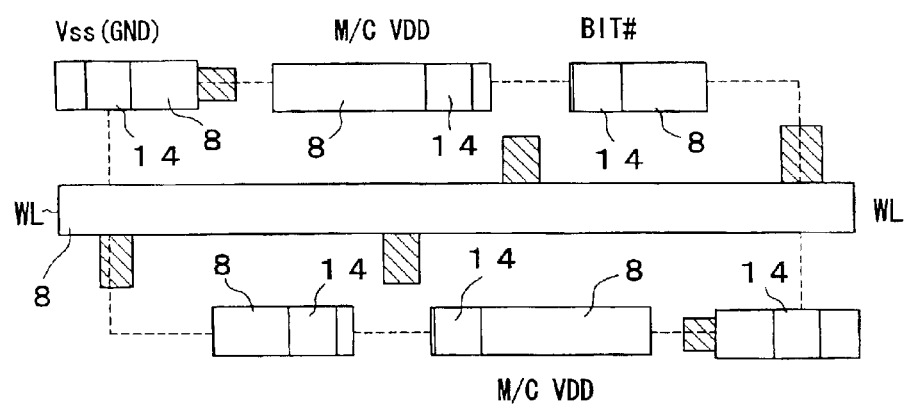
FIG. 10 is a plan view of a step of burying tungsten in a first via hole and removing tungsten from the other area by etching.

(u) Tungsten is buried in the first via hole 14, and tungsten is removed by etching except for the tungsten in the first via hole 14, as shown in FIG. 10. In this manner, an electric connection from the first metal layer 8 to a further upper layer can be formed.

(v) A second metal layer 9 is deposited, and it is removed except for predetermined portions. In this manner, a bit line, a VDD line, and a ground (GND) line can be formed by the second metal layer 9.

(w) An insulating interlayer 6d is deposited.

(x) A hole for a second via hole is formed by etching.

(y) Tungsten is buried in the second via hole, and the tungsten is removed except for the second via hole.

Figure 11:
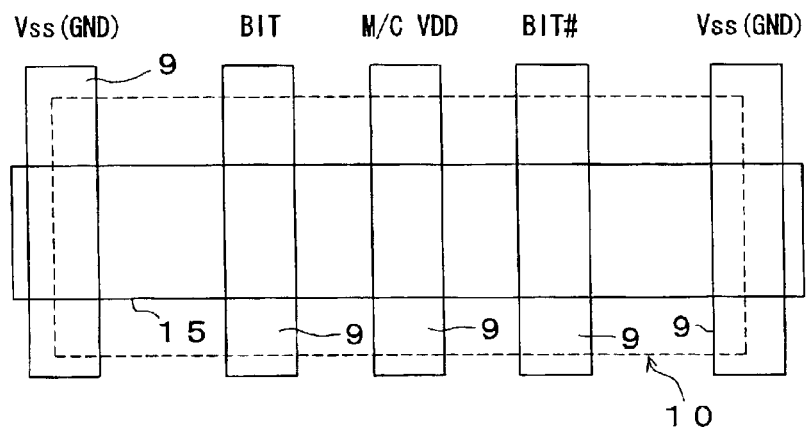
FIG. 11 is a plan view of a step of depositing a third metal layer and etching the third metal layer in the method.

(z) A third metal wiring element 15 is deposited, and it is removed except for predetermined portions, as shown in FIG. 11.

With the above steps, the semiconductor storage device described above can be obtained. A semiconductor storage device is fabricated by this method. The semiconductor storage device includes first and second gate wiring elements 3 each having a rectangular shape having straight line on opposite sides opposite to each other without a notch or a projection. In addition, the first and second gate wiring elements 3 can be regularly laid out along the longitudinal direction of the word line. In this manner, the transistor characteristics of the driver transistor 11, the load transistor 12, the access transistor 13, and the like constituting the semiconductor storage device can be stabilized and uniformed. Therefore, a semiconductor storage device having stable characteristics can be obtained.

Figure 12:
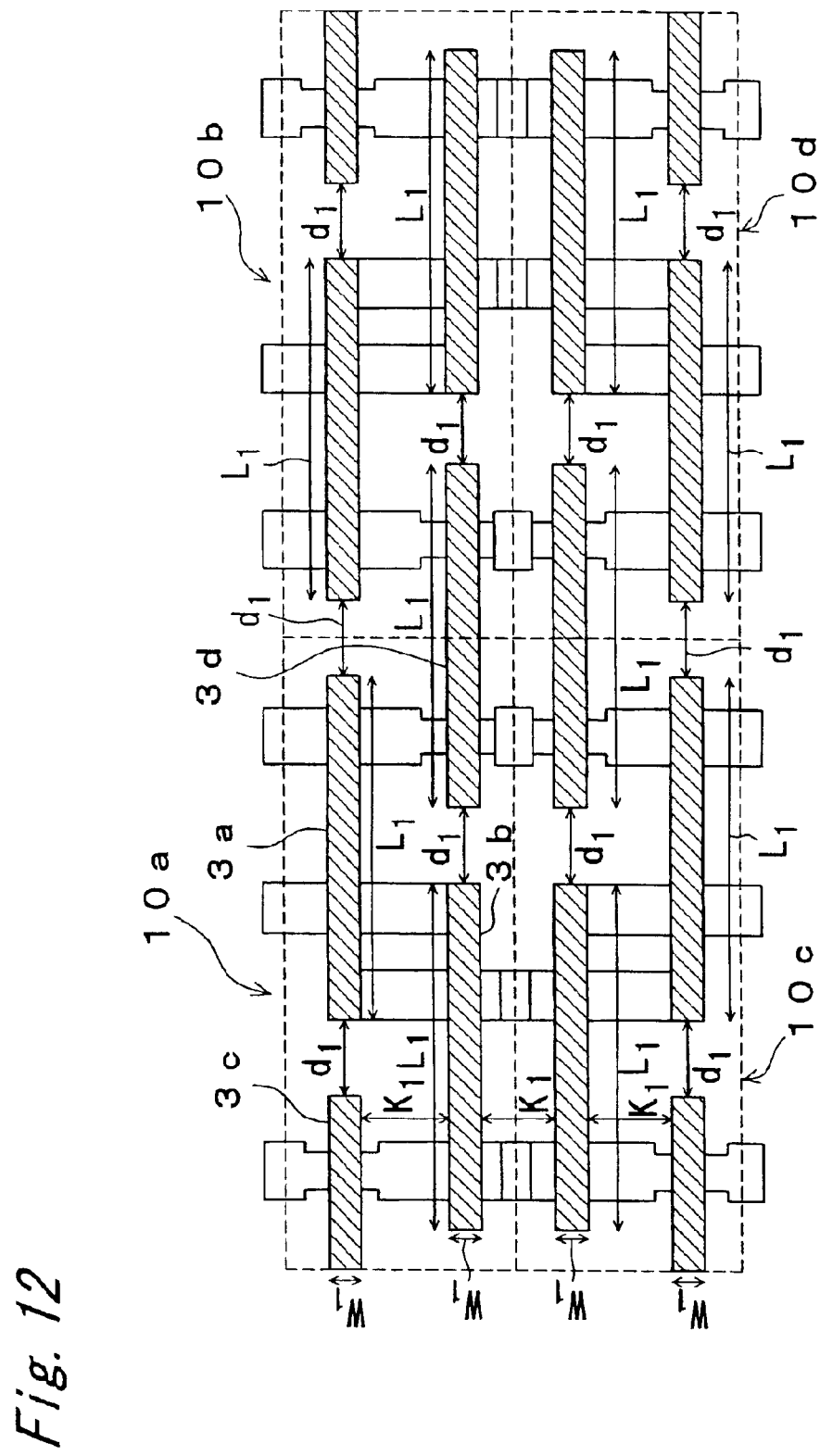
FIG. 12 is a plan view of a step of forming gate wiring elements in four memory cells of a semiconductor storage device according to a second embodiment of the present invention.

A semiconductor storage device according to second embodiment of the present invention will be described below with reference to plan views showing the configurations of four memory cells in FIGS. 12 to 14. The semiconductor storage device is different from that according to first embodiment except that, as shown in FIG. 12, distance (pitches) d1 of the first gate wiring elements 3a and 3b and the second gate wiring elements 3c and 3d in the longitudinal direction are substantially equal to each other. For this reason, since generation of optical proximity effect can be suppressed in the photolithography process, the shapes of gate wiring elements need not be deformed for optical proximity correction (OPC). Therefore, a yield can be prevented from being decreased by shortage of lithographic margin. Furthermore, lithographic resolution can be improved.

Figure 13:
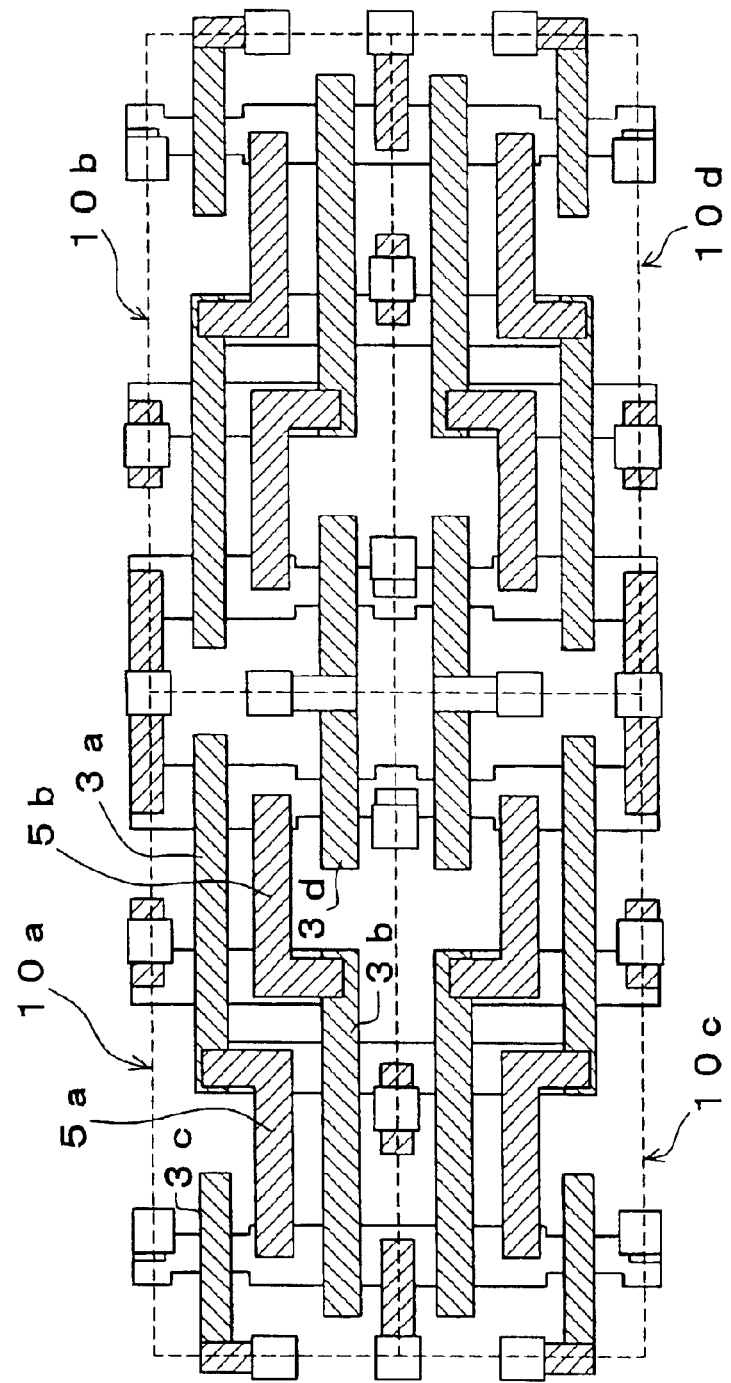
FIG. 13 is a plan view of a configuration in which the four gate wiring elements in the four memory cells of the semiconductor storage device according to the second embodiment are centered.

The semiconductor storage device, as shown in FIG. 13, four memory cells are constituted as one repetitive unit. More specifically, a memory cell 10a and another 10b have mirror symmetry with respect to the configurations of gate wiring elements. The memory cells 10a and 10c are mirror-symmetrical each other. Therefore, the memory cells 10a and 10d have the same gate wiring elements, and the memory cell 10b and 10c have the same configurations of gate wiring elements. The repetitive unit is not limited to the above-mentioned repetitive unit, and a repetitive unit including a plurality of memory cells may be constituted by properly selecting a configuration of gate wiring elements.

Figure 14:
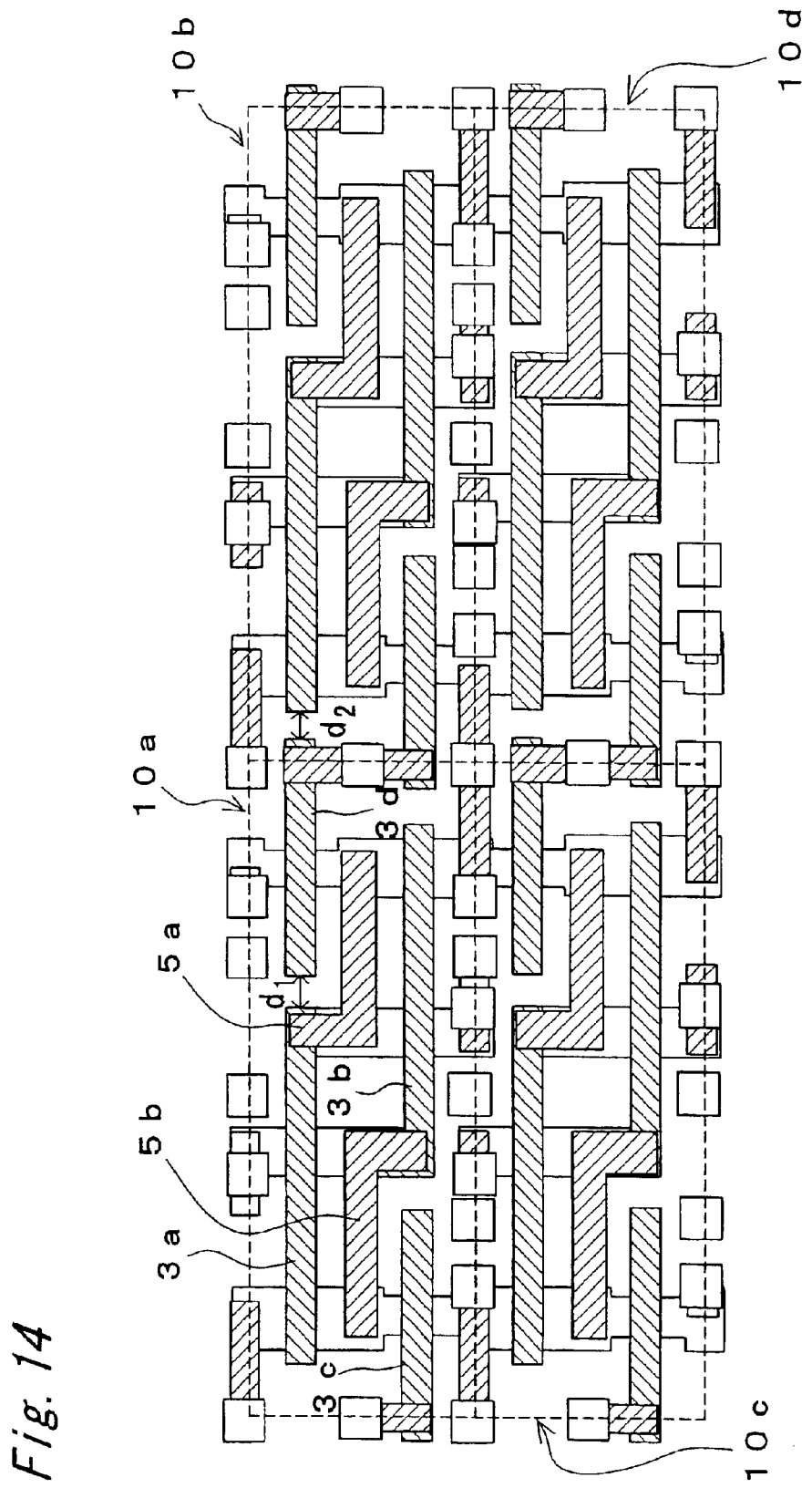
FIG. 14 is a plan view of another configuration in which gate wiring elements of four memory cells of the semiconductor storage device according to the second embodiment of the present invention are centered.

As shown in FIG. 14, another configuration of the semiconductor storage device, a memory cell array may be constituted such that the configuration of the gate wiring elements of one memory cell 10a is directly used as a repetitive unit. In this case, each of the memory cells 10b, 10c, and 10d has the same configuration of gate wiring elements as that of the memory cell 10a.

A semiconductor storage device according to third embodiment of the present invention will be described below. This semiconductor storage device is different from that according to second embodiment except that the lengths and distance between gate wiring elements in the longitudinal direction in the first gate wiring elements 3a and 3b and the second gate wiring elements 3c and 3d are substantially equal to each other, respectively, and the widths and the distance between the gate wiring elements in a direction (second direction) perpendicular to the longitudinal direction are equal to each other, respectively. For this reason, since generation of optical proximity effect can be suppressed in a photolithography process, the shapes of gate wiring elements need not be deformed for optical proximity correction (OPC). Therefore, a yield can be prevented from being deteriorated by a shortage of lithographic margin. In addition, when a regular layout pattern is used, photolithography can be performed at high accuracy by using super resolution technique.

The lengths, widths, and the like of the first and second gate wiring elements are made substantially equal to each other, respectively, and the distance between the gate wiring elements are made equal to each other, so that burying spacing between the layers can be kept uniform. Therefore, as an insulating interlayer, not only a boron phosphorous silicate glass (BPSG) film having good overhang properties, but also a film such as an nitride silicate glass (NSG) film or a phosho-silicate glass (PSG) film using a material having relatively poor overhang properties can be used. For this reason, a high degree of freedom of material selection can be obtained, and the cost can be reduced. In addition, a material of the insulating interlayer can be selected depending on conditions such as machining difficulties, a dielectric constant to be set, the degree of difficulty of void generation, and a soft error.

Figure 15:
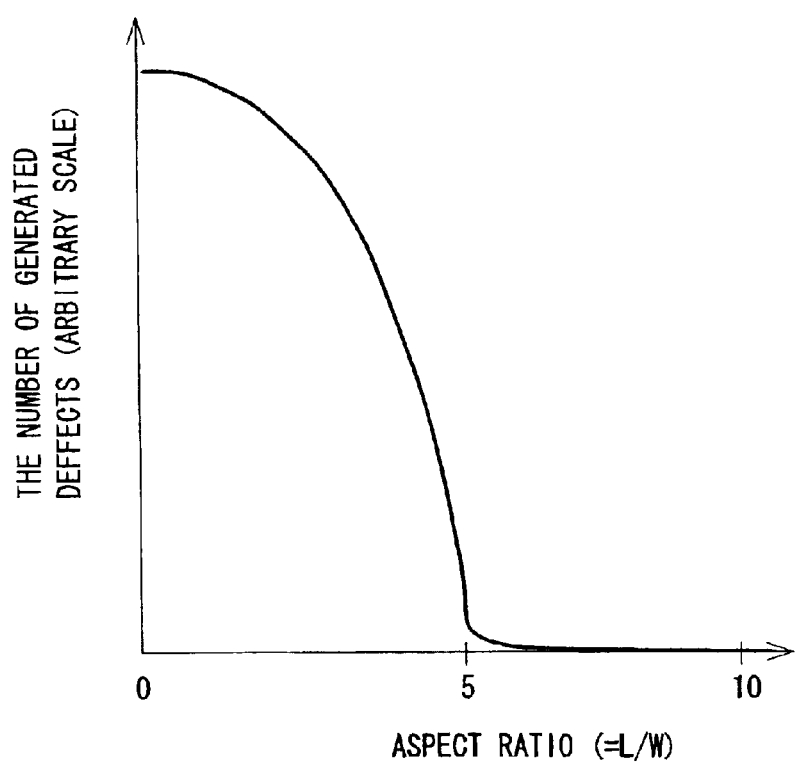
FIG. 15 is a graph on a relationship between an aspect ratio of a gate wiring element and the number of generated defects in a semiconductor storage device according to a fourth embodiment of the present invention.
Figure 16:
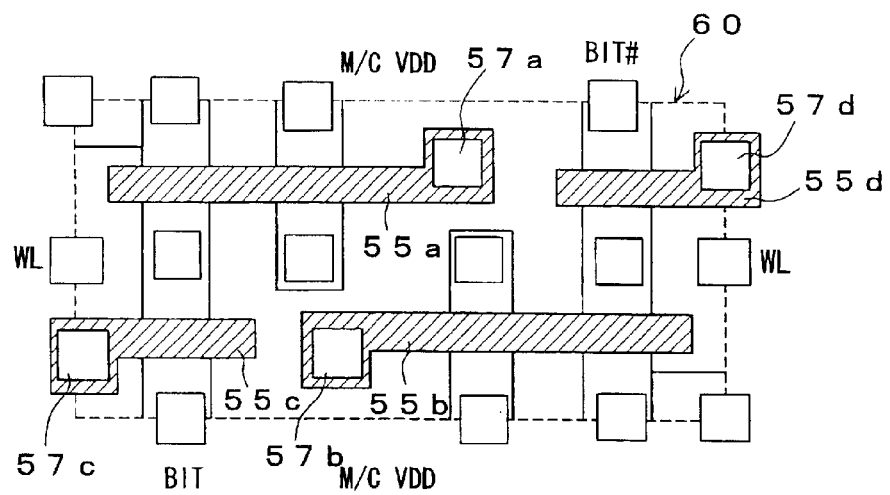
FIG. 16 is a plan view of a configuration in which gate wiring elements in a prior art semiconductor storage device are centered.
Figure 17:
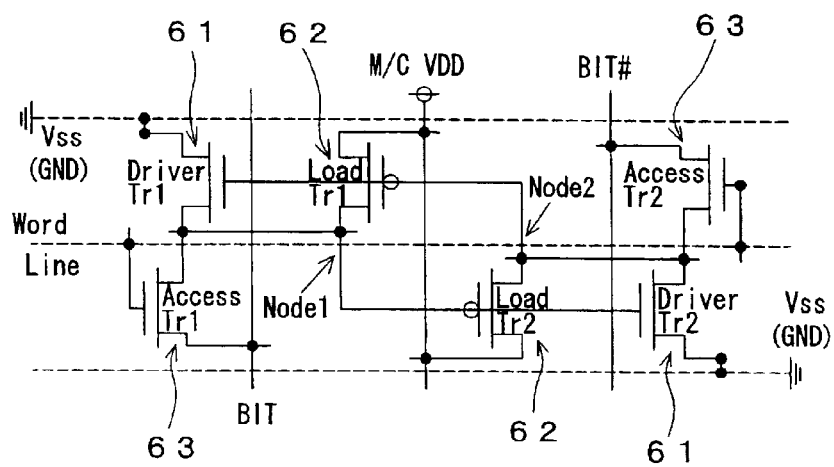
FIG. 17 is a circuit diagram of an equivalent circuit corresponding to one memory cell of the semiconductor storage device shown in FIG. 16.

A semiconductor storage device according to fourth embodiment of the present invention will be described below with reference to the graph in FIG. 15. FIG. 15 shows a relationship between an aspect ratio x of a gate wiring element and the number of generated defects when the width (shorter side W) of each gate wiring element is set to be 0.15 $\mu$m. As shown in FIG. 15, this semiconductor storage device has an aspect ratio x of longer side length L to shorter side length W of each of first and second wiring elements being 5 or more. In this manner, the aspect ratio of the gate wiring element is set to be 5 or more, the number of generated defects such as pattern disappearance in a photolithography process can be considerably reduced.

In the semiconductor storage device according to the present invention, the first gate wiring element and the second gate wiring element have rectangular shapes each having straight line on opposite sides and being free from a notch or a projection, and are linearly laid out. In this manner, since the first and second gate wiring elements can be formed at high accuracy, the characteristics of transistors constituting a memory cells can be stabilized. For this reason, a semiconductor storage device having stable characteristics can be obtained. In the semiconductor storage device, contacts to the respective wiring elements are formed by using local inter connectors (LICs). More specifically, the contacts of the respective gate wiring elements are not formed through via holes directly formed on the gate wiring elements, but the contacts are formed by the local inter connectors (LICs) formed by tungsten damascene. When the local inter connectors (LICs) are used, regular gate wiring elements each having a rectangular shape can be laid out without making a cover margin for contact in formation of the gate wiring elements. In addition, since the first gate wiring elements and the second gate wiring elements are laid out in parallel to each other, in the step of forming gate wiring elements by photolithography process, pattern distortion caused by interference can be suppressed. Therefore, an optical proximity effect in the photolithography process can be suppressed.

In the semiconductor storage device according to the present invention, the longitudinal directions of the first and second gate wiring elements extend in the direction of the gate width of an access transistor. For this reason, the longitudinal directions of the gate wiring elements can be made equal to the longer side of the memory cell.

In addition, in the semiconductor storage device according to the present invention, the distance (pitches) of the first and second gate electrodes are made substantially equal to each other in the longitudinal direction (first direction). In this manner, since generation of an optical proximity effect can be suppressed in photolithography process, the shapes of the gate wiring elements need not be deformed for optical proximity effect correction (OPC). A decrease in yield caused by a shortage of lithographic margin can be prevented. A lithographic resolution can also be improved. In addition, since the characteristics of the respective transistors obtained as described above can be made uniform and stable, a semiconductor storage device having stable characteristics can be obtained.

In the semiconductor storage device according to the present invention, since the distance between the first and second gate wiring elements can be made substantially equal to each other, an optical proximity effect can be further suppressed in photolithography process. For this reason, a decrease in yield caused by a shortage of lithographic margin can be prevented. A lithographic resolution can also be improved. In addition, since the characteristics of the respective transistors obtained as described above can be made uniform and stable, a semiconductor storage device having stable characteristics can be obtained.

Furthermore, in the semiconductor storage device according to the present invention, since the first and second gate wiring elements have shorter sides having lengths which are substantially equal to each other, a optical proximity effect can be further suppressed in photolithography process. For this reason, a decrease in yield caused by a shortage of lithographic margin can be prevented. A lithographic resolution can also be improved.

Still furthermore, in the semiconductor storage device according to the present invention, the shapes of the first gate wiring elements and the second gate wiring elements projected on a plane parallel to the substrate can be made substantially equal to each other, so that burying spacing between the layers can be kept uniform. Therefore, as an insulating interlayer, not only a BPSG film having good overhang properties, but also a film such as an NSG film or a PSG film using a material having relatively poor overhang properties can be used. For this reason, a high degree of freedom of material selection can be obtained, and the cost can be reduced. In addition, a material of the insulating interlayer can be selected depending on conditions such as machining difficulties of chemical mechanical polishing, a dielectric constant to be set, the degree of difficulty of void generation, and a soft error.

In the semiconductor storage device according to the present invention, the first and second gate wiring elements are symmetrically arranged with respect to a predetermined symmetrical point. For this reason, a mask can be used such that the mask is rotated about the predetermined symmetrical point.

Furthermore, in the semiconductor storage device according to the present invention, an aspect ratio x of longer side L to shorter side W of each of the first and second gate wiring elements is 5 or more. When the aspect ratio of the gate wiring element is set to be 5 or more, the number of generated defects such as pattern disappearance can be considerably reduced.

Still furthermore, in the semiconductor storage device according to the present invention, the lengths of the shorter sides of the first and second gate wiring elements are 0.15 $\mu$m or less, the respective memory cells can be decreased patterning size.

In the semiconductor storage device according to the present invention, since the first and second local inter connectors consist of tungsten damascene, a contact margin for making a contact to a gate wiring element is not required. For this reason, the shapes of the gate wiring elements need not be deformed for a margin for contact in formation of the gate wiring elements.

In the semiconductor storage device according to the present invention, the longitudinal directions of the first and second gate wiring elements are arranged in parallel to each other. For this reason, formation of the gate wiring elements can be simplified. Therefore, the fabricating steps can be simplified.

In the semiconductor storage device according to the present invention, since the distance between the first and second gate wiring elements adjacent to each other in at least one of the first and second directions are made substantially equal to each other, an optical proximity effect can be suppressed in photolithography process. For this reason, a decrease in yield caused by a shortage of lithographic margin can be prevented. A lithographic resolution can also be improved. In addition, since the characteristics of the respective transistors obtained as described above can be made uniform and stable, a semiconductor storage device having stable characteristics can be obtained.

In the semiconductor storage device according to the present invention, the projected shapes of the first gate wiring elements and the second gate wiring elements on a plane parallel to the substrate can be made substantially equal to each other, so that burying spacing between the layers can be kept uniform. Therefore, as an insulating interlayer, not only a BPSG film having good overhang properties, but also a film such as an NSG film or a PSG film using a material having relatively poor overhang properties can be used. For this reason, a high degree of freedom of material selection can be obtained, and the cost can be reduced. In addition, a material of the insulating interlayer can be selected depending on conditions such as machining difficulties of chemical mechanical polishing, a dielectric constant to be set, the degree of difficulty of void generation, and a soft error.

In the semiconductor storage device according to the present invention, the contacts are made by the first and second connectors without directly forming contact holes in the first and second gate wiring elements. Therefore, the gate wiring elements do not require contact margins for contact. Therefore, the shapes of the gate wiring elements need not be deformed for contact margins in formation of the gate wiring elements.

In the method of fabricating a semiconductor storage device according to the present invention, the first and second gate wiring elements having rectangular shapes each having straight line on opposite sides and being free from a notch or a projection can be formed. In addition, the first and second gate wiring elements can be regularly laid out along the longitudinal direction of a word line. For this reason, the characteristics of transistors such as a driver transistor and an access transistor constituting the semiconductor storage device can be made stable and uniform. Therefore, a semiconductor storage device having stable characteristics can be obtained.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A semiconductor storage device comprising:
a memory cell array comprising memory cells each having first and second driver transistors, first and second load transistors, and first and second access transistors, the memory cells being two-dimensionally arranged on a semiconductor substrate;
a plurality of word lines connected to the memory cells and arranged in parallel to each other along a first direction;
a plurality of bit lines connected to the memory cells, the bit lines being arranged in parallel to each other along a second direction perpendicular to the first direction;
a first gate wiring element composing a gate electrode of the first driver transistor and the first load transistor, and having a rectangular shape having straight line on opposite sides;
a second gate wiring element composing a gate electrode of the access transistor, and having a rectangular shape having straight line on opposite sides;
a first connector connecting the first gate wiring element, an active region of the second driver transistor, and an active region of the second load transistor to each other; and
a second connector connecting the second gate wiring element to the word lines to each other.

2. A semiconductor storage device according to claim 1, wherein the first and second wiring elements are arranged to have longitudinal directions of the first and second gate wiring elements extending in a direction of gate width of the access transistor.

3. A semiconductor storage device according to claim 1, wherein the first and second gate wiring elements are arranged to have longitudinal directions of the first and second gate wiring elements in parallel to each other along the first direction.

4. A semiconductor storage device according to claim 1, wherein the first and second gate wiring elements are arranged to have substantially the same distance between one of the first gate wiring element and one of the second gate wiring element adjacent to each other in the first direction.

5. A semiconductor storage device according to claim 1, wherein the first and second gate wiring elements are arranged to have substantially the same distance between one of the first gate wiring element and one of the second gate wiring element adjacent to each other in the second direction.

6. A semiconductor storage device according to claim 1, wherein the first and second gate elements have shorter sides having substantially equal lengths to each other.

7. A semiconductor storage device according to claim 1, wherein shapes of the first gate wiring element and the second gate wiring element projected on a plane parallel to the substrate are substantially the same.

8. A semiconductor storage device according to claim 1, wherein the first and second gate wiring elements are point-symmetrical with respect to a point.

9. A semiconductor storage device according to claim 1, wherein the first and second gate wiring elements have an aspect ratio of longer side to shorter side not less than 5.

10. A semiconductor storage device according to claim 9, wherein shorter sides of the first and second gate wiring elements have lengths not longer than 0.15 $\mu$m.

11. A semiconductor storage device according to claim 1, wherein each first and second connector is made of tungsten damascenes.

* * * * *